United States Patent
Huang et al.

(10) Patent No.: US 9,807,879 B2
(45) Date of Patent: Oct. 31, 2017

(54) CONNECTION APPARATUS FOR ELECTRICALLY CONDUCTIVE PADS AND TOUCH CONTROL SCREEN

(71) Applicant: Shanghai Tianma Micro-Electronics Co., Ltd., Shanghai (CN)

(72) Inventors: Zhongshou Huang, Shanghai (CN); Jialing Li, Shanghai (CN); Jun Ma, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 301 days.

(21) Appl. No.: 14/058,157

(22) Filed: Oct. 18, 2013

(65) Prior Publication Data
US 2015/0015529 A1    Jan. 15, 2015

Related U.S. Application Data

(63) Continuation of application No. PCT/CN2012/085864, filed on Dec. 4, 2012.

(30) Foreign Application Priority Data

Sep. 5, 2012   (CN) .......................... 2012 1 0325848

(51) Int. Cl.
*G06F 3/045*   (2006.01)
*H05K 1/14*    (2006.01)
(Continued)

(52) U.S. Cl.
CPC ......... *H05K 1/144* (2013.01); *G02F 1/13338* (2013.01); *G06F 3/044* (2013.01);
(Continued)

(58) Field of Classification Search
CPC ...... G06F 3/0412; G06F 3/0416; G06F 3/044; H05K 1/111; H05K 1/144; G02F 1/13338;
(Continued)

(56) References Cited

U.S. PATENT DOCUMENTS 6,366,331 B1 * 4/2002 Sakamoto ........... G02F 1/13452
349/149
2006/0213278 A1 * 9/2006 Arms ....................... G01B 7/16
73/781
(Continued)

FOREIGN PATENT DOCUMENTS

CN     101067699 A     11/2007
CN     101067702 A     11/2007
(Continued)

OTHER PUBLICATIONS

Extended European Search Report as issued in corresponding European Application No. 12874364.8, dated Apr. 10, 2015.

*Primary Examiner* — Amare Mengistu
*Assistant Examiner* — Crystal A Mathews
(74) *Attorney, Agent, or Firm* — Alston & Bird LLP

(57) ABSTRACT

A connection apparatus for electrically conductive pads includes a first substrate and a second substrate arranged in opposition, wherein a plurality of first electrically conductive pads are arranged on the inside of the first substrate, and a plurality of second electrically conductive pads are arranged on the inside of the second substrate. An electrically conductive glue is arranged between the first electrically conductive pads and the second electrically conductive pads, and the first electrically conductive pads each include a first body, the second electrically conductive pads each include a second body, and the first body and/or the second body includes a hollow portion or portions. The electrically conductive pads with a hollow portion(s) allowing light rays (Continued)

to illuminate and solidify the electrically conductive for bonding and interconnecting the upper and lower electrically conductive pads.

13 Claims, 3 Drawing Sheets

(51) Int. Cl.
    *G02F 1/1333* (2006.01)
    *G06F 3/041* (2006.01)
    *G06F 3/044* (2006.01)
    *H05K 1/11* (2006.01)
    *H05K 3/32* (2006.01)
    *H05K 3/36* (2006.01)

(52) U.S. Cl.
    CPC ............ *G06F 3/0416* (2013.01); *H05K 1/111* (2013.01); *G02F 2201/122* (2013.01); *G02F 2202/28* (2013.01); *G02F 2203/01* (2013.01); *H05K 3/323* (2013.01); *H05K 3/368* (2013.01); *H05K 2201/0108* (2013.01); *H05K 2201/042* (2013.01); *H05K 2201/0969* (2013.01); *H05K 2201/10136* (2013.01); *Y02P 70/611* (2015.11)

(58) Field of Classification Search
    CPC .................. Y02P 70/611; B32B 37/12; B32B 2037/1253
    See application file for complete search history.

(56) References Cited

U.S. PATENT DOCUMENTS

| | | | |
|---|---|---|---|
| 2008/0079889 A1 | 4/2008 | Lee et al. | |
| 2009/0086150 A1* | 4/2009 | Koyama | G02B 27/2214 349/153 |
| 2010/0075720 A1* | 3/2010 | Lee | G06F 1/1626 455/566 |
| 2010/0309160 A1* | 12/2010 | Lin | G06F 3/0418 345/174 |
| 2011/0316802 A1* | 12/2011 | Choi | G06F 3/041 345/173 |
| 2012/0021159 A1* | 1/2012 | Yeh | G06F 3/044 428/38 |
| 2012/0062511 A1* | 3/2012 | Ishizaki | G06F 3/044 345/174 |
| 2012/0086669 A1* | 4/2012 | Kim | G06F 3/044 345/174 |
| 2012/0105337 A1 | 5/2012 | Jun et al. | |
| 2013/0069894 A1* | 3/2013 | Chen | G06F 3/0412 345/173 |
| 2013/0093697 A1* | 4/2013 | Sun | G06F 3/044 345/173 |
| 2013/0147727 A1* | 6/2013 | Lee | G06F 3/0412 345/173 |
| 2013/0222345 A1* | 8/2013 | Chuang | G06F 3/044 345/175 |
| 2014/0061597 A1* | 3/2014 | Choi | H01L 51/5284 257/40 |
| 2014/0160064 A1* | 6/2014 | Yairi | G06F 3/04895 345/174 |
| 2015/0220179 A1* | 8/2015 | Kimura | G06F 3/044 345/174 |

FOREIGN PATENT DOCUMENTS

| | | |
|---|---|---|
| CN | 101120626 A | 2/2008 |
| CN | 101174736 A | 5/2008 |
| CN | 101859213 A | 10/2010 |
| CN | 102341232 A | 2/2012 |
| CN | 102375578 A | 3/2012 |
| JP | S-347464 A | 12/1993 |
| JP | 2009170437 A | 7/2009 |

\* cited by examiner

CONNECTION APPARATUS FOR ELECTRICALLY CONDUCTIVE PADS AND TOUCH CONTROL SCREEN

CROSS-REFERENCES TO RELATED APPLICATIONS

The present application is a continuation of and claims priority to International Application No.: PCT/CN2012/085864, filed Dec. 4, 2012, designating the United States, which claims priority to Chinese Patent Application No.: 20121032,5848.2, filed with the Chinese Patent Office on Sep. 5, 2012 and entitled "ELECTRICAL CONNECTION STRUCTURE OF ELECTRICALLY CONDUCTIVE PADS AND TOUCH CONTROL SCREEN WITH THE SAME STRUCTURE", the contents of which are hereby incorporated by reference in their entirety,

FIELD OF THE INVENTION

The present invention relates to the field of touch control and particularly to a connection apparatus for electrically conductive pads and a touch control screen.

BACKGROUND OF THE INVENTION

Capacitive touch control screens have become predominant in the current market of touch control products due to their positioning precision and sensitivity, good touch feeling, long lifetime, support of multipoint touch control and other advantages. The majority of existing capacitive touch control screens are configured in a on-cell structure, that is, a touch control screen panel is joined to the outside of a display panel. This on-cell structure inevitably increases the thickness and weight of the entire displayer to thereby degrade the optical transmittance, which conflicts with the required light-weight and slim development trend of the displayer.

In view of this, an in-cell capacitive touch control screen has been proposed in the industry, that is, a capacitive touch control screen is integrated inside a display panel, to thereby achieve double effects of a high optical transmittance and a light-weight and slim product. The currently best integration scheme is definitely to integrate the capacitive touch control screen inside the liquid crystal display panel.

However the in-cell capacitive touch control screen with the capacitive touch control screen integrated inside the liquid crystal display panel suffers from numerous technology problems, one of Which is the problem of connection of a touch control signal line of the capacitive touch control screen with an integration circuit. The touch control signal line of the integrated in-cell capacitive touch control screen is arranged on the inside of a substrate of the liquid crystal panel, so the touch control signal line of the in-cell capacitive touch control screen cannot be connected to the integration circuit as done in the on-cell capacitive touch control screen. In order to connect the touch control signal line of the in-cell capacitive touch control screen with the integration circuit, the inventors proposed such a solution that electrically conductive pads are arranged on the inside of the substrate of the liquid crystal panel and then the electrically conductive pads on the liquid crystal panel are electrically connected to the integrated circuit with electrically conductive glue including electrically conductive balls. However in this solution, the electrically conductive glue usually has to be solidified only after being sufficiently illuminated with ultraviolet and thermally treated, and since the existing electrically conductive pads are typically made of the entire metal layer with a poor optical transmittance (sometimes with an additional metal oxide layer connected externally on the metal layer), the electrically conductive pads tend to block ultraviolet light from illuminating the electrically conductive glue, thus easily resulting in poor solidification of the electrically conductive glue.

SUMMARY OF THE INVENTION

In order to address the foregoing problem of poor solidification of the electrically conductive glue arising from the existing electrically conductive pads tending to block the electrically conductive glue, embodiments of the invention disclose a connection apparatus for electrically conductive pads, the apparatus including:

a first substrate and a second substrate arranged in opposition such that an inside surface of the first substrate faces an inside surface of the second substrate;

a plurality of first electrically conductive pads arranged on the inside surface of the first substrate, and a plurality of second electrically conductive pads arranged on the inside surface of the second substrate; and an electrically conductive glue layer arranged between the first electrically conductive pads and the second electrically conductive pads; and wherein the first electrically conductive pads each include a first body, second electrically conductive pads each include a second body, and one or both of the first body and the second body comprises one or more hollow portions.

According to one embodiment, the first body and/or the second body is in the shape of one or a combination of a circle, a semicircle, an ellipse, a sector, an arc and a polygon.

According to one embodiment, the first electrically conductive pads each further include a first lead terminal connected to the first body; and the second electrically conductive pads each include a second lead terminal connected to the second body.

According to one embodiment, the first body and the first lead terminal are made of the same metal layer; and the second body and the second lead terminal are made of the same metal layer.

According to one embodiment, the hollow portions are distributed in the body in dots.

According to one embodiment, the hollow portions are distributed in the body in grids.

According to one embodiment, the first body and the first lead terminal are covered with a transparent electrically-conductive layer.

According to one embodiment, the transparent electrically-conductive layer has the same external outline as that of the first body.

According to one embodiment, the second body and the second lead terminal are covered with a transparent electrically-conductive layer.

According to one embodiment, the transparent electrically-conductive layer has the same external outline as that of the second body.

According to one embodiment, the hollows portions are distributed in the body in strips.

According to one embodiment, the hollow portion is in the same shape as that of the body and located centrally in the body.

According to one embodiment, the electrically conductive glue includes a glue body and electrically conductive balls, and the electrically conductive balls have respective ones of the first electrically conductive pads electrically connected to corresponding ones of the second electrically conductive pads and insulated from each other.

According to one embodiment, the first substrate is one of a color filter substrate and an array substrate, and the second substrate is the other of a color filter substrate and an array substrate.

In order to address the foregoing problem, embodiments of the invention further provide a touch control screen including:

the connection apparatus for electrically conductive pads as described above, wherein the first substrate is arranged with touch control electrodes and a plurality of signal leads connected to the touch control electrodes, and respective ones of the signal leads are electrically connected to corresponding ones of the first electrically conductive pads; and a touch control circuit including a plurality of signal lines, wherein respective ones of the signal lines are electrically connected to corresponding ones of the second electrically conductive pads.

The embodiments of the invention has the following advantages over the prior art:

Since the connection apparatus for electrically conductive pads disclosed according to the embodiments of the invention includes electrically conductive pads with a hollow portion(s), a lot of light rays can be transmitted through the electrically conductive pads to thereby ensure that electrically conductive glue with which the electrically conductive pads are subsequently covered can be sufficiently illuminated with light and that the electrically conductive glue can be solidified at a better level to thereby prevent the situations of corrosion and falling-off of the electrically conductive glue arising from poor solidification of the glue and also prevent the situation of poor electrically connection of the electrically conductive pads.

Since the connection apparatus for electrically conductive pads disclosed according to the embodiments of the invention includes the foregoing electrically conductive pads with a hollow portion(s), light rays can be transmitted through the electrically conductive pads to illuminate the electrically conductive glue between the upper and lower electrically conductive pads to have the electrically conductive glue solidified at a desired level for the purpose of bonding and interconnecting the upper and lower electrically conductive pads.

Since the touch control screen disclosed according to the embodiments of the invention includes the foregoing electrically conductive pads with a hollow portion(s), sufficient light rays can illuminate the electrically conductive glue between the electrically conductive pads to have the electrically conductive glue solidified at a desired level for both a corresponding bonding strength and the function of electrically conductive connection while lowering the possibility of the electrically conductive pads being eroded.

BRIEF DESCRIPTION OF TUE DRAWINGS

DESCRIPTION OF THE SPECIFIC EMBODIMENTS

In the solution as mentioned in the background section that electrically conductive pads are arranged on the inside of a substrate of a liquid crystal panel and the electrically conductive pads on the liquid crystal panel are electrically connected to an integrated circuit with electrically conductive glue including electrically conductive balls. The electrically conductive glue is typically composed of a non-conductive glue body and electrically conductive balls, and the glue body is typically an adhesive composed of a plurality of chemical substances generally including a base material of resin, a photo initiator, a photo terminator, a hardener, etc. The electrically conductive glue used in this solution is similar to frame glue used in a liquid crystal production process and typically has to be illuminated with ultraviolet (UV) and heated with a hot blast stove to have the components of its internal glue body subjected to a chemical action forming a stable giant molecule structure so that a sufficient bonding strength can be achieved in the end.

Figure 1:
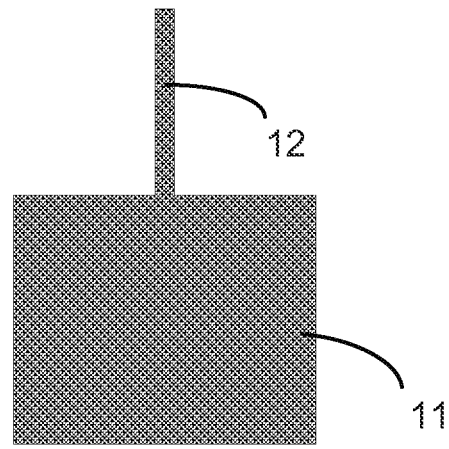
FIG. 1 is a schematic diagram of an electrically conductive pad in the prior art.

Reference is made to FIG. 1 illustrating a schematic diagram of an electrically conductive pad in the related art. As can be apparent from FIG. 1, the electrically conductive pad includes a body 11 and a lead terminal 12, where the body 11 is a rectangular structure and also has a side connected to the lead terminal 12, and the lead terminal 12 is used for connection with a signal line. The body 11 is a part in the electrically conductive pad, contacts with an electrically conductive ball and has some area. Since the body 11 of the existing electrically conductive pad is a flat, solid and integral metal layer structure, the body 11 tends to block light rays so that electrically conductive glue overlying the body 11 may be insufficiently illuminated with light. If the electrically conductive glue is insufficiently illuminated with light, a glue body of the electrically conductive glue may undergo an insufficient chemical action and consequently may be solidified poorly. On one hand, poor solidification of the glue body may degrade the bonding strength of the electrically conductive glue and the effect of electrical connection of electrically conductive pads, and on the other hand, un-solidified components of the glue body may fall on and consequently erode the electrically conductive pad, and a foreign matter of substance may penetrate into the un-solidified glue and arrive at the surface of the electrically conductive pad and consequently erode and destroy the electrically conductive pad.

Figure 2:
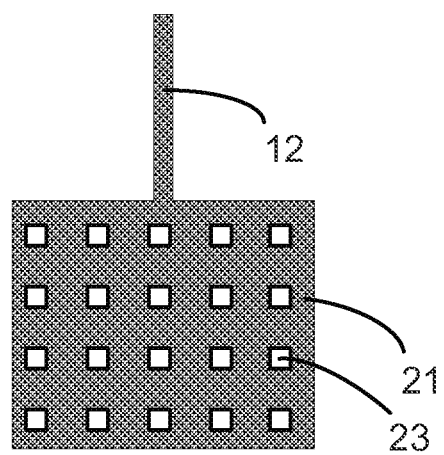
FIG. 2 is a schematic diagram of an electrically conductive pad according to a first embodiment of the invention.

Reference is made to FIG. 2 illustrating a schematic diagram of an electrically conductive pad according to a first embodiment of the invention. The electrically conductive pad according to this embodiment is a result of directly improving the existing electrically conductive pad illustrated in FIG. 1 and therefore similar to the electrically conductive pad in FIG. 1 and includes two parts, i.e., a body 21 and a lead terminal 12. Different from the electrically conductive pad in FIG. 1, the body 21 of the electrically conductive pad according to this embodiment includes a plurality of hollow portions 23 arranged in dots, all of which are located in the body 21. Although there are hollow portions 23 arranged in dots, the body 21 in the electrically conductive pad still includes a relatively large part of metal layer structure, so when the electrically conductive pad in FIG. 2 is covered with electrically conductive glue including electrically conductive balls, there are sufficient electrically conductive balls in contact with the body 21 of the electrically conductive pad to thereby ensure the function of electrical conduction of the electrically conductive pad. Also due to the presence of the dot-like hollow portions 23, a lot of light rays can be transmitted through the electrically conductive pad so that a glue body part of the electrically conductive glue can be sufficiently illuminated with light to thereby ensure that the electrically conductive glue can be solidified at a desired level.

It shall be noted that in this embodiment, the electrically conductive pad includes the lead terminal 12, but the electrically conductive pad may not include the lead terminal 12 in other embodiments as long as a signal line is electrically connected directly with the body 21 of the electrically conductive pad. Also in this embodiment, the body 21 in the electrically conductive pad is in the shape of a rectangle, but the body 21 in the electrically conductive pad may be in the shape of a triangle, a pentagon, a hexagon or other polygons or a cycle, a semicircle, an ellipse, a sector, an arc or other patterns or a combination thereof in other embodiments. Also as can be apparent from FIG. 2, in this embodiment, each of the dot-like hollow portions 23 arranged in dots is in the shape of a square, but the dot-like hollow portion 23 will not be limited to the shape of a square but can also be in the shape of another polygon or a cycle, a semicircle, an ellipse, a sector, an arc or a combination thereof in other embodiments.

Figure 3:
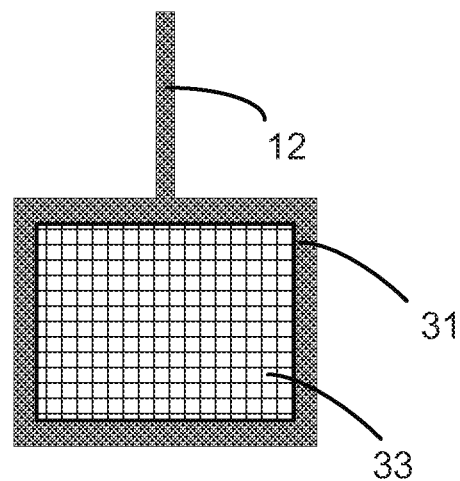
FIG. 3 is a schematic diagram of an electrically conductive pad according to a second embodiment of the invention.

Reference is made to FIG. 3 illustrating a schematic diagram of an electrically conductive pad according to a second embodiment of the invention. Similar to that in FIG. 2, the electrically conductive pad in this embodiment also includes two parts which are a body 31 and a lead terminal 12. However, different from the first embodiment, the body 31 of the electrically conductive pad in this embodiment includes therein hollow portions 33 arranged in a grid-like pattern. Similar to the first embodiment, all of the hollow portions 33 are located in the body 31 in this embodiment. In this embodiment, the hollow portions 33 in the grid-like pattern can further greatly improve the proportion of light rays transmitted through the electrically conductive pad so that when the electrically conductive pad is covered with electrically conductive glue, the electrically conductive glue can be illuminated with more light and consequently solidified more fully. Also the arrangement of the grid-like hollow portions 33 can further have dense metal lines arranged in the body 31 in the electrically conductive pad, where these metal lines enable the body 31 to still ensure sufficient contact of sufficient electrically conductive balls with the electrically conductive pad to thereby ensure the function of electrical connection of the electrically conductive pad, it shall be noted that in this embodiment, the grid-like pattern is in the shape of square grids as illustrated in FIG. 3, but the pattern can alternatively be of grids otherwise shaped, e.g., a triangle or a hexagon in other embodiments of the invention, and the invention will not be limited to any particularly disclosed grid pattern.

Figure 4:
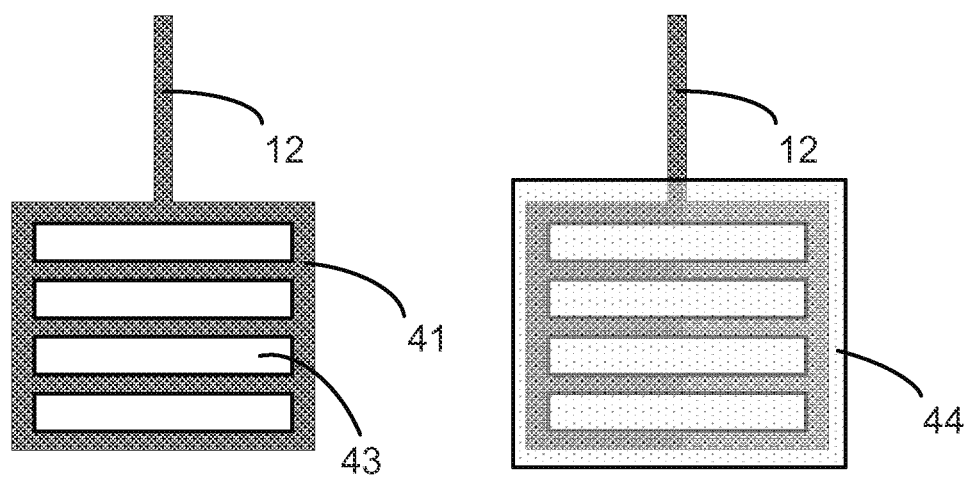
FIG. 4 is a schematic diagram of an electrically conductive pad according to a third embodiment of the invention.

Reference is made to FIG. 4 illustrating a schematic diagram of an electrically conductive pad according to a third embodiment of the invention. Similar to the first embodiment and the second embodiment, the electrically conductive pad in this embodiment also include two parts which are a body 41 and a lead terminal 12 (see the electrically conductive pad on the left FIG. 4 (the electrically conductive pad illustrated here is only apart of the structure). However, unlike the foregoing embodiments, in this embodiment, there are a plurality of strip-shaped hollow portions 43 with a large area, and also the body 41 is covered with a transparent electrically-conductive layer 44 (see the entire electrically conductive pad on the right in FIG. 4). Preferably the transparent electrically-conductive layer 44 has an external outline designed the same as that of the body 41 to thereby facilitate complete coverage of the body 41 with the transparent electrically-conductive layer 44 and also save a material of which the electrically-conductive layer 44 is made. Since in this embodiment, each strip-shaped hollow 43 has a large area, such a situation may arise that electrically conductive balls may subsequently fall in the strip-shaped hollow portions 43 instead of coming into contact with the body 41 with the absence of the transparent electrically-conductive layer 44. Thus in embodiment, the body 41 is covered with the transparent electrically-conductive layer 44 to thereby ensure that the electrically conductive pad still can well function for electrical conduction. The additional transparent electrically-conductive layer 44 almost will not hinder light rays from being transmitted through the electrically conductive pad, and with the presence of the strip-shaped hollow portions 43 with a large area, a lot of light rays can be transmitted through the electrically conductive pad and illuminate the electrically conductive glue with which the electrically conductive pad is subsequently covered so that the electrically conductive glue can be sufficiently illuminated with light and solidified at a desired level, and this way the electrically conductive glue can have a sufficient bonding strength and also the solidified electrically conductive glue itself will neither easily erode the electrically conductive pad nor easily let a foreign matter of substance enter the bonding structure and erode the electrically conductive pad, thus also lowing the possibility of the electrically conductive pad being eroded.

Figure 5:
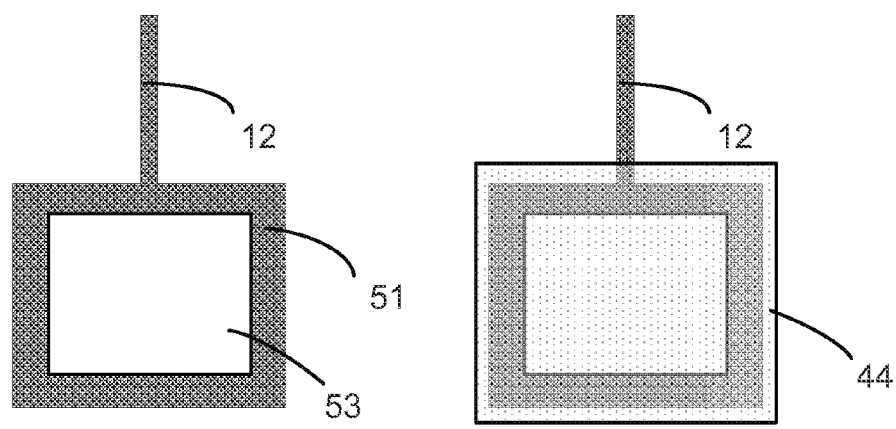
FIG. 5 is a schematic diagram of an electrically conductive pad according to a fourth embodiment of the invention.

Reference is made to FIG. 5 illustrating a schematic diagram of an electrically conductive pad according to a fourth embodiment of the invention. Like all the foregoing embodiments, the electrically conductive pad in this embodiment includes two parts which are a body 51 and a lead terminal 12, see the electrically conductive pad on the left FIG. 5 (the electrically conductive pad illustrated here is only a part of the structure). In this embodiment, a hollow portion 53 in the body 51 in the electrically conductive pad is in the shape of a rectangle, that is, the hollow portion 53 is in the similar shape as that of the body 51, and preferably the hollow portion 53 is located centrally in the body 51. This design of the electrically conductive pad with the body 51 having a large-area portion therein hollowed enables a lot of light rays to be transmitted through the electrically conductive pad. In order to ensure the function of electrical connection of the electrically conductive pad, a transparent electrically-conductive layer 44 is arranged on the body 51 in this embodiment (similar to the third embodiment), see the entire electrically conductive pad on the right in FIG. 5, to thereby ensure that the design of the hollow portion 53 will not degrade the function of electrical connection of the electrically conductive pad.

It shall be noted that the transparent electrically-conductive layer 44 is preferably made of indium tin oxide in the third embodiment and the fourth embodiment of the invention. Indium tin oxide which is transparent metal oxide has both a transparency and an electrical conductivity satisfying the requirement of the embodiments of the invention.

Figure 6:
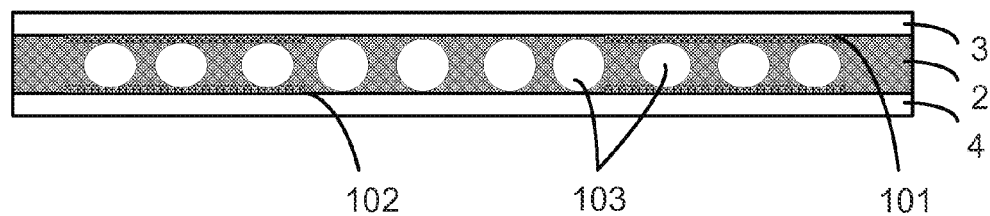
FIG. 6 is a schematic diagram of a connection apparatus for electrically conductive pads according to an embodiment of the invention.

The invention provides a connection apparatus for electrically conductive pads, the connection apparatus including a plurality of the foregoing electrically conductive pads, with reference to FIG. 6. The connection apparatus according to this embodiment includes a first substrate 3 and a second substrate 4 arranged in opposition. A plurality of electrically conductive pads 101 (two adjacent ones are representatively illustrated in FIG. 6) are arranged on the inside surface of the first substrate 3. A plurality of second electrically conductive pads 102 are arranged on the inside surface of the second substrate 4. Electrically conductive glue layer 2 including electrically conductive balls 103 is arranged between the first electrically conductive pads 101 of the first substrate 3 and the second electrically conductive pads 102 of the second substrate 4.

As can be apparent from FIG. 6, a part of the electrically conductive balls 103 fall between the first electrically conductive pads 101 of the first substrate 3 and the second electrically conductive pads 102 on the inside of the second substrate 4, and this part of the electrically conductive balls 103 have respective ones of the first electrically conductive pads 101 on the first substrate 3 electrically connected to corresponding ones of the second electrically conductive pads 102 on the second substrate 4. And another part of the electrically conductive balls 103 fall between two adjacent first electrically conductive pads 101 on the inside of the same substrate. This is because the electrically conductive balls 103 in the electrically conductive glue 2 are dispersed randomly in the electrically conductive glue and some of the electrically conductive balls 103 will fall between two adjacent first electrically conductive pads 101 on the inside of the same substrate. However since the electrically conductive balls 103 are in the electrically conductive glue 2 at an appropriate density, the electrically conductive glue 2 can ensure no short circuit to occur between the first electrically conductive pads 101, that is, ensure no short circuit to occur between the second electrically conductive pads 102.

As can be ascertained from FIG. 6, the existing electrically conductive pad (as illustrated in FIG. 1) is structured in an integral metal layer and may block light rays from illuminating the electrically conductive glue 2. However the electrically conductive pad according to the foregoing embodiments of the invention (as illustrated in FIG. 2 to FIG. 5) includes a hollow portion(s) and can have light rays transmitted to illuminate the electrically conductive glue 2 so that the electrically conductive glue 2 is solidified at a desired level. Thus in this embodiment, at least the first electrically conductive pad 101 or the second electrically conductive pad 102 is the electrically conductive pad with a hollow portion(s) according to the foregoing embodiments because in order to ensure ultraviolet rays to illuminate the glue body of the electrically conductive glue 2, at least the first electrically conductive pad 101 or the second electrically conductive pad 102 shall be ensured to include a hollow portion(s).

Although not illustrated in FIG. 6, in the foregoing connection apparatus for electrically conductive pads according to this embodiment, respective ones of the first electrically conductive pads 101 on the first substrate 3 are connected to corresponding ones of touch control signal lines which are in turn connected to touch control electrodes on the first substrate 3. Respective ones of the second electrically conductive pads 102 on the second substrate 4 also are connected to corresponding ones of touch control signal lines which are in turn connected to an integrated circuit configured to control a touch control signal. The electrically conductive glue 2 has the first electrically conductive pads 101 on the first substrate 3 electrically connected one-to-one with the second electrically conductive pads on the second substrate 4 and also has every two adjacent electrically conductive pads on the same substrate insulated from each other. Thus the entire connection apparatus for electrically conductive pads can achieve the purpose of electrically connecting the touch control electrodes of an in-cell capacitive screen with the integrated circuit.

It shall be noted that in the connection apparatus for electrically conductive pads according to the foregoing embodiment of the invention, the first substrate 3 and the second substrate 4 each can be one of a color filter substrate and an array substrate, that is, when the first substrate 3 is a color filter substrate, the second substrate 4 is an array substrate; and when the first substrate 3 is an array substrate, the second substrate 4 is a color filter substrate.

An embodiment of the invention further provides a touch control screen.

The touch control screen according to the invention includes the foregoing connection apparatus for electrically conductive pads. Particularly in an embodiment, the touch control screen includes a first substrate and a second substrate arranged in opposition, a plurality of first electrically conductive pads are arranged on the inside of the first substrate, and a plurality of second electrically conductive pads are arranged on the inside of the second substrate, electrically conductive glue is arranged between the first electrically conductive pads and the second electrically conductive pads, the first electrically conductive pads each include a first body, the second electrically conductive pads each include a second body, at least one of the first body and the second body includes a hollow portion(s), the first substrate is arranged with touch control electrodes and a plurality of signal leads connected to the touch control electrodes, and each of the signal leads is electrically connected to corresponding one of the first electrically conductive pads; and the touch control screen further includes a touch control circuit including a plurality of signal lines, and each of the signal lines is electrically connected to corresponding one of the second electrically conductive pads, where at least the first electrically conductive pads or the second electrically conductive pads are electrically conductive pads newly designed as described hereinbefore in the Description.

In the touch control screen, every two corresponding electrically conductive pads are connected by electrically conductive glue including electrically conductive balls, thus in the foregoing touch screen including the electrically conductive pads according to the foregoing respective embodiments of the invention, the electrically conductive pads include a hollow portion(s) so that it can be ensured that sufficient light rays will illuminate the electrically conductive glue and have the electrically conductive glue solidified at a desired level for both a corresponding bonding strength and the function of electrically conductive connection while lowering the possibility of the electrically conductive pads being eroded.

In this embodiment, the electrically conductive glue is arranged between the first electrically conductive pads electrically connected to the signal leads and the second electrically conductive pads electrically connected to the signal lines, and the electrically conductive balls on the electrically conductive glue enable respective ones of the first electrically conductive pads electrically connected to the signal leads to be electrically connected to respective ones of the second electrically conductive pads electrically connected to the signal lines.

In the foregoing touch control screen, the first substrate is one of a color filter substrate and an array substrate of a liquid crystal panel, and the touch electrodes and the signal leads are arranged on the inside of the first substrate facing a liquid crystal layer, and at this time the touch control screen is an in-cell capacitive touch control liquid crystal display screen.

The respective sections of this specification give a description in a progressive manner, each section puts an emphasis on a difference(s) from the other sections, and for common or like points across the respective sections, reference can be made to each other.

The foregoing description is merely illustrative of particular embodiments of the invention for the purpose of enabling those skilled in the art to better understanding the spirit of the invention, but the scope of the invention will not be limited to the foregoing detailed description of the particular embodiments, and any skilled in the art can modify the particular embodiments of the invention without departing from the spirit and scope of the invention.

What is claimed is:

1. A connection apparatus for connecting electrically conductive pads in an in-cell capacitive touch screen with an integrated circuit, comprising:
    a first substrate and a second substrate arranged in opposition such that an inside surface of the first substrate faces an inside surface of the second substrate, wherein the first substrate is transparent;
    an electrically conductive and curable glue layer comprising electrically conductive balls is arranged between one of the plurality of first electrically conductive pads and one of the plurality of second electrically conductive pads, wherein the electrically conductive balls connect said first electrically conductive pad and said second electrically conductive pad; and
    a plurality of cutouts disposed in one of the plurality of first electrically conductive pads in a periphery area of the in-cell capacitive touch screen, wherein the cutouts allow light to pass from the first substrate into the connecting area glue layer for better curing, and wherein at least one of the electrically conductive balls is arranged in a position corresponding to one of the cutouts; and
    wherein each of the plurality of first electrically conductive pads disposed with cutouts is covered with a first transparent electrically-conductive layer; and wherein the transparent electrically-conductive layer is arranged between the electrically conductive and curable glue layer and each of the plurality of first electrically conductive pads.

2. The connection apparatus for electrically conductive pads according to claim 1, the first electrically conductive pads each comprises a first body, the second electrically conductive pads each comprises a second body, wherein one or both of the first body and the second body comprising a shape of:
    a circle, a semicircle, an ellipse, a sector, an arc, and a polygon.

3. The connection apparatus for electrically conductive pads according to claim 2, wherein the first transparent electrically-conductive layer has a same external outline as that of the first body.

4. The connection apparatus for electrically conductive pads according to claim 2, wherein each of the plurality of second electrically conductive pads is covered with a second transparent electrically-conductive layer.

5. The connection apparatus for electrically conductive pads according to claim 4, wherein the second transparent electrically-conductive layer has a same external outline as that of the second body.

6. The connection apparatus for electrically conductive pads according to claim 1, wherein the plurality of first electrically conductive pads and the first touch control signal line are made in a same conductive layer; and the plurality of second electrically conductive pads and the second touch control signal line are made in a same conductive layer.

7. The connection apparatus for electrically conductive pads according to claim 1, wherein the cutouts are shaped in grids.

8. The connection apparatus for electrically conductive pads according to claim 1, wherein the cutouts are distributed over the area of the transparent electrically-conductive layer.

9. The connection apparatus for electrically conductive pads according to claim 1, wherein the first substrate is a color filter substrate and the second substrate is an array substrate, or the first substrate is the array substrate and the second substrate is the color filter substrate.

10. A touch control screen, comprising a connection apparatus for connecting electrically conductive pads in an in-cell capacitive touch screen with an integrated circuit, the connection apparatus for electrically conductive pads comprises:
    a first substrate and a second substrate arranged in opposition such that an inside surface of the first substrate faces an inside surface of the second substrate, wherein the first substrate is transparent;
    an electrically conductive and curable glue layer comprising electrically conductive balls is arranged between one of the plurality of first electrically conductive pads and one of the plurality of second electrically conductive pads, wherein the electrically conductive balls connect said first electrically conductive pad and said second electrically conductive pad; and
    a plurality of cutouts disposed in one of the plurality of first electrically conductive pads in a periphery area of the in-cell capacitive touch screen, wherein the cutouts allow light to pass from the first substrate into the connecting area glue layer for better curing, and wherein at least one of the electrically conductive balls is arranged in a position corresponding to one of the cutouts; and
    wherein each of the plurality of first electrically conductive pads disposed with cutouts [T1] is covered with a first transparent electrically-conductive layer; and wherein the transparent electrically-conductive layer is arranged between the electrically conductive and curable glue layer and each of the plurality of first electrically conductive pads.

11. The touch control screen according to claim 10, the first electrically conductive pads each comprises a first body, the second electrically conductive pads each comprises a second body, wherein the first body and/or the second body comprising a shape of:
    a circle, a semicircle, an ellipse, a sector, an arc and a polygon.

12. The touch control screen according to claim 10, wherein the cutouts are distributed over the area of the transparent electrically-conductive layer.

13. The touch control screen according to claim 10, wherein the first substrate is a color filter substrate and the second substrate is an array substrate, or the first substrate is the array substrate and the second substrate is the color filter substrate.

* * * * *